United States Patent
Oyamada et al.

(10) Patent No.: US 8,436,345 B2
(45) Date of Patent: May 7, 2013

(54) ORGANIC ELECTROLUMINESCENCE DEVICE

(75) Inventors: Takahito Oyamada, Machida (JP); Taishi Tsuji, Tsurugashima (JP); Yasuhiro Takahashi, Yonezawa (JP)

(73) Assignee: Pioneer Corporation, Kawasaki-shi, Kanagawa (JP)

( * ) Notice: Subject to any disclaimer, the term of this patent is extended or adjusted under 35 U.S.C. 154(b) by 292 days.

(21) Appl. No.: 13/057,343

(22) PCT Filed: Aug. 4, 2008

(86) PCT No.: PCT/JP2008/063962
§ 371 (c)(1),
(2), (4) Date: Mar. 17, 2011

(87) PCT Pub. No.: WO2010/016101
PCT Pub. Date: Feb. 11, 2010

(65) Prior Publication Data
US 2011/0169045 A1    Jul. 14, 2011

(51) Int. Cl.
*H01L 51/30*    (2006.01)
(52) U.S. Cl.
USPC .................. 257/40; 257/E51.026; 438/99
(58) Field of Classification Search .............. 257/40, 257/E51.018–E51.022, E51.026; 438/22–47, 438/99
See application file for complete search history.

(56) References Cited

U.S. PATENT DOCUMENTS
2008/0203406 A1*   8/2008   He et al. ................ 257/94

FOREIGN PATENT DOCUMENTS

| GB | 2 439 013 A | 12/2007 |
|----|-------------|---------|
| JP | 2005-123094 | 5/2005 |
| JP | 2006-173619 | 6/2006 |
| JP | 2007-088015 | 4/2007 |
| JP | 2007-180277 | 7/2007 |
| JP | 2008-098475 | 4/2008 |
| WO | WO 2006/015567 A1 | 2/2006 |

* cited by examiner

*Primary Examiner* — Julio J Maldonado
*Assistant Examiner* — Daniel Shook
(74) *Attorney, Agent, or Firm* — Drinker, Biddle & Reath LLP (57) ABSTRACT

An organic electroluminescence device includes a plurality of organic semiconductor layers including an organic light-emitting layer and layered or disposed between a pair of anode and cathode opposed to each other. The device includes n-type-dopant-containing electron transport layer disposed between the cathode and the organic light-emitting layer. The n-type-dopant-containing electron transport layer includes an organic compound capable of transporting electrons as a first component which mixed with an n-type dopant of an electron donor of metallic atom or ion thereof as a second component. The organic electroluminescence device further includes an n-type-dopant blocking layer having an interface contacting with the n-type-dopant-containing electron transport layer to block the n-type dopant. The n-type-dopant blocking layer includes a heavy atom compound including at least one kind of heavy atoms with an atomic weight of 79 or more.

9 Claims, 4 Drawing Sheets

ORGANIC ELECTROLUMINESCENCE DEVICE

TECHNICAL FIELD

The present invention relates to organic electroluminescence devices and particularly to an organic electroluminescence (abbreviated as EL) device utilizing organic compounds having electric charge-transporting properties (hole and/or electron mobility) and comprising an organic light-emitting layer made of such an organic compound thereof.

BACKGROUND ART

Conventionally, the organic EL films of an organic EL device have a lamination structure of a plurality of layered organic material layers. The organic material layers includes an organic light-emitting layer and also a material layer having a hole-transporting capability such as a hole injection layer, a hole transport layer or the like, as well as a material layer having an electron transporting capability such as an electron transport layer, an electron injection layer or the like. The electron injection layer may include an inorganic compound such as alkaline metal, alkaline earth metal or a compound which contains those of electron donating materials or only one electron donating martial, or may be made of a mixture of such an inorganic compound and an organic compound.

When an electric field is applied to the multilayered organic EL film of the organic light-emitting layer and electron or hole transport layers etc. being layered, then holes are injected from the source electrode as well as electrons are injected from drain electrode and these are recombined in the organic light-emitting layer so that excitons are generated. When the excitons return from an excited state to a ground state, light is emitted. In order to improve a luminous efficiency of the device, it is important to efficiently move electrons or the like carriers to the interface of the light emitting layer. The organic active light-emitting device also employs the multilayered structure utilizing organic compounds having charge-transporting properties i.e., electric charge transporting organic compounds.

It is well known that the organic EL device with the organic light-emitting layer is capable of a low voltage operation, but it is driven with a higher driving voltage in comparison with a light emitting diode or the like. There is a problem that a driving voltage of a phosphorescence organic EL device with a high quantum efficiency of light emission is higher than that of a fluorescence organic EL device.

Generally it is possible to reduce a driving voltage by setting to decrease the thicknesses of organic layers in the organic EL device. In this case there is increase in occurrence of defective electricity between the electrodes i.e., anode and cathode of the device, resulting in decrease of yields on products of the organic EL devices. An attempt to resolve such a problem has been made in a manner that a dopant is introduced into an adjacent layer to the electrode, i.e., a charge transport layer to raise the conductivity of the charge transport layer. Alkaline metal or alkaline earth metal and an organic compound may be used for the dopant doped into the charge transport layer through a co-evaporation so as to reduce efficiently a driving voltage of the organic EL device. However, since these alkaline metal and alkaline earth metal have deliquescence and absorbency, it is difficult to handle them. Especially alkaline metal and alkaline earth metal such as metal cesium etc. having a low work function exhibit a high doping efficiency, but it is very dangerous to deal with the metal cesium in the air due to instability thereof. In view of the instability, it has been confirmed that a similar effect may be obtained by using the salt of alkaline metal or alkaline earth metal and an organic compound for the dopant.

More recently, there have been suggested a phosphorescence organic EL device with a high power efficiency and a display and an illuminator that employ the same. This organic EL device has at least two layers of a hole blocking layer and an electron transport layer between a light-emitting layer containing at least one kind of phosphorescence emission dopant and at least one kind of host compound and a cathode, wherein the hole blocking layer contains an organic compound having triplet state transition energy of 2.8 eV or more and metallic atoms or ions having a work function of 2.9 eV or lower. (See Patent Literature 1).

It is valid to provide a charge injection layer to enhance a light-emitting efficiency of the organic EL device. Furthermore there is a demand for an organic EL device being capable of being driven for a long time continually with a higher light-emitting efficiency, and, a life-prolonged organic EL device is needed.

For the purpose to provide a stable organic EL element capable of being driven by a low voltage during a long-time storage without deterioration in luminance, there have been suggested another organic EL device. This organic EL element includes organic layers disposed between an anode and a cathode, in which at least one layer of the organic layers contains a metal salt, and further includes a diffusion preventing layer to suppress diffusion of metallic ions of the metal salt. (See Patent Literature 2)

Patent Literature 1: Japanese Unexamined Patent Publication No. 2007-180277

Patent Literature 2: Japanese Unexamined Patent Publication No. 2007-088015

DISCLOSURE OF THE INVENTION

Problem to be Solved by the Invention

However, the last Patent Literature does not disclose a specific diffusion of metallic ions of the metal salt with respect to the diffusion-preventing layer and describe an efficiency of suppression against the diffusion of ions.

However, the inventor has revealed firstly that some luminance deterioration is caused by diffused metallic ions in a long-range storage of the organic EL device.

Accordingly, there is one of exemplary tasks to be achieved by the present invention to provide an organic electroluminescence device comprising an n-type-dopant-containing electron transport layer and capable of being life-prolonged stably in a long-range storage and a high temperature preservation without luminance deterioration.

Means for Solving the Problem

An organic electroluminescence device according to the present invention is an organic electroluminescence device comprising: a pair of anode and cathode opposed to each other; a plurality of organic semiconductor layers layered or disposed between the anode and the cathode, the organic semiconductor layers including an organic light-emitting layer; and an n-type-dopant-containing electron transport layer disposed between the cathode and the organic light-emitting layer, the n-type-dopant-containing electron transport layer including an organic compound capable of transporting electrons as a first component which mixed with an n-type dopant of an electron donor of metallic atom or ion thereof as a second component, characterized by further comprising an n-type-dopant blocking layer having an interface contacting with the n-type-dopant-containing electron transport layer to block the n-type dopant, wherein the n-type-dopant blocking layer comprises a heavy atom compound including at least one kind of heavy atoms with an atomic weight of 79 or more.

EXPLANATION OF REFERENCE NUMERALS

| | |
|---|---|
| 1 | Substrate |
| 2 | Anode |
| 3 | Hole injection layer |
| 4 | Hole transport layer |
| 5 | Light emitting layer |
| 6 | N-type-dopant blocking layer |
| 7 | N-type-dopant-containing electron transport layer |
| 7A | Electron injection layer |
| 8 | Cathode |
| 56 | N-type dopant-blocking light-emitting layer |

DETAILED DESCRIPTION OF THE INVENTION

The embodiments according to the present invention will be described herein below with reference to the drawings.

Figure 1:
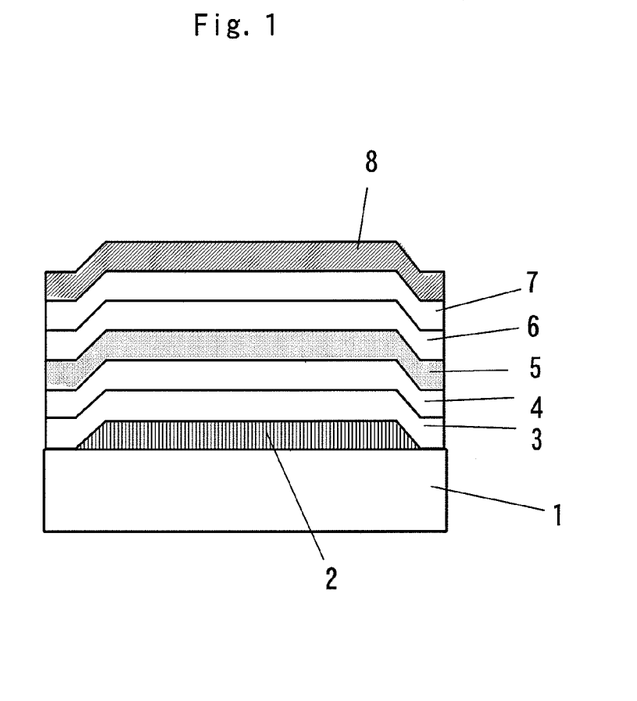
FIG. 1 is a schematic partial cross section view showing an organic EL device according to an embodiment of the present invention.

One example of organic EL devices of the embodiments, as shown in FIG. 1, comprises: a transparent anode 2; a hole transport layer 4; an organic light-emitting layer 5; an n-type-dopant blocking layer 6; an n-type-dopant-containing electron transport layer 7; and a cathode 8 made of metal, which are successively laminated on a transparent substrate 1 made of, for example, glass, plastic or the like. The hole transport layer 4, the organic light-emitting layer 5, the n-type-dopant blocking layer 6 and the n-type-dopant-containing electron transport layer 7 are organic semiconductor layers. Namely, the organic EL device includes: a pair of the anode and cathode opposed to each other; and a plurality of organic semiconductor layers layered or disposed therebetween which include the hole injection layer, the hole transport layer, and the light-emitting layer. The components of the organic semiconductor layers etc. will be described herein below in detail.

Figure 2:
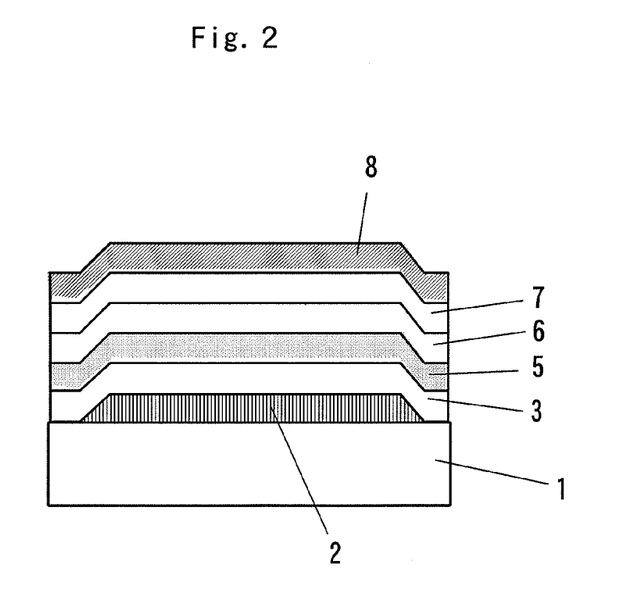
FIG. 2 is a schematic partial cross section view showing an organic EL device according to another embodiment of the present invention.
Figure 3:
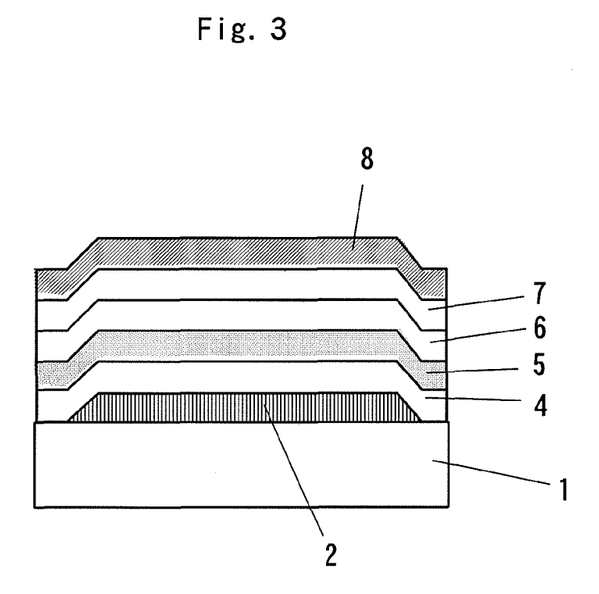
FIG. 3 is a schematic partial cross section view showing an organic EL device according to another embodiment of the present invention.
Figure 4:
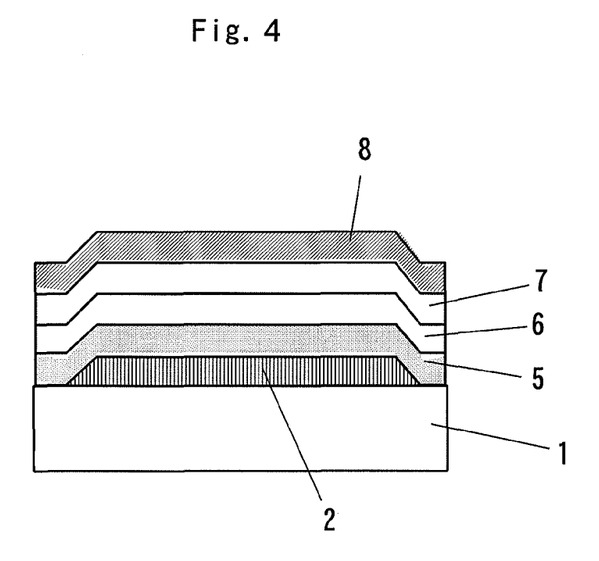
FIG. 4 is a schematic partial cross section view showing an organic EL device according to another embodiment of the present invention.

In addition to the layered structure of the anode 2/hole injection layer 3/hole transport layer 4/light-emitting layer 5/n-type-dopant blocking layer 6/n-type-dopant-containing electron transport layer 7/cathode 8 as shown in FIG., there is a layered structure of the anode 2/hole injection layer 3/light-emitting layer 5/n-type-dopant blocking layer 6/n-type-dopant-containing electron transport layer 7/cathode 8 as shown in FIG. 2, included in the invention. The "/" denotes an interface between adjacent layers contacting one another. Furthermore, there are layered structures, e.g., FIG. 3 shows a structure of the anode 2/hole transport layer 4/light-emitting layer 5/n-type-dopant blocking layer 6/n-type-dopant-containing electron transport layer 7/cathode 8; and FIG. 4 shows a structure of the anode 2/light-emitting layer 5/n-type-dopant blocking layer 6/n-type-dopant-containing electron transport layer 7/cathode 8, which are included in the invention.

Figure 5:
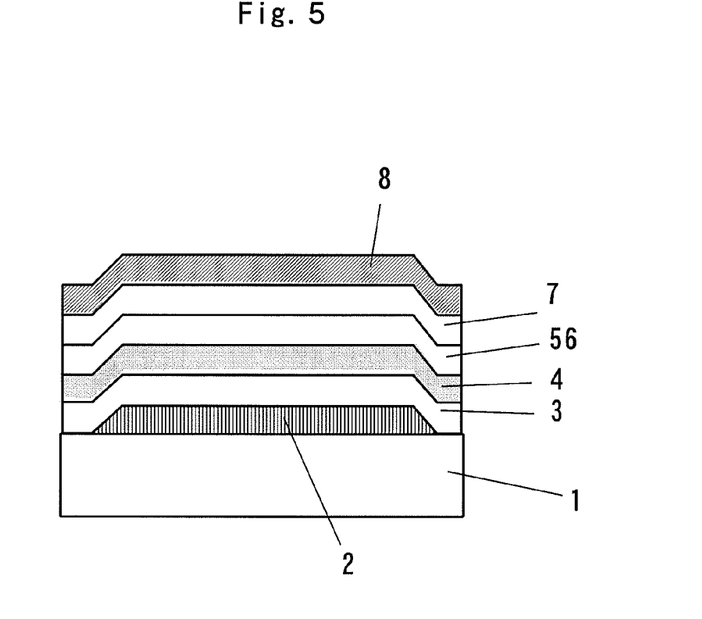
FIG. 5 is a schematic partial cross section view showing an organic EL device according to another embodiment of the present invention.

Moreover, the invention includes a modification in which an n-type-dopant blocking layer serves as a light-emitting layer unified in one piece so as to have an n-type dopant-blocking light-emitting layer, e.g., FIG. 5 shows such a layered structure of the anode 2/hole injection layer 3/hole transport layer 4/n-type dopant-blocking light-emitting layer 56/n-type-dopant-containing electron transport layer 7/cathode 8.

Figure 6:
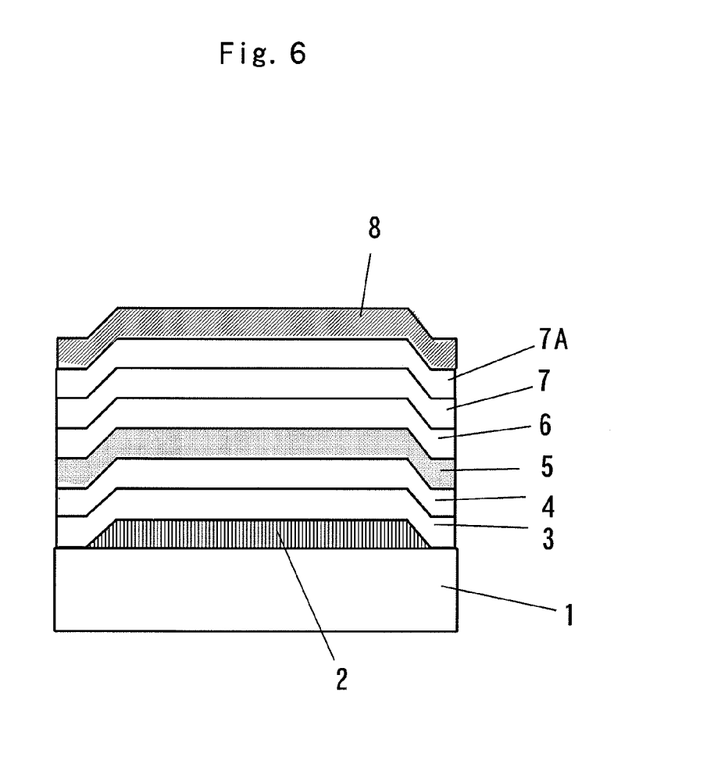
FIG. 6 is a schematic partial cross section view showing an organic EL device according to another embodiment of the present invention.

In addition, the invention includes a further modification having a layered structure of, as shown in FIG. 6, the anode 2/hole injection layer 3/hole transport layer 4/light-emitting layer 5/n-type-dopant blocking layer 6/n-type-dopant-containing electron transport layer 7/electron injection layer 7A/cathode 8. Further, the invention includes a still further modification comprising an electron injection layer made of a compound which contains a metallic atom or ion thereof (i.e., n-type-dopant-containing electron injection layer), as having a layered structure of the anode/hole injection layer/hole transport layer/light-emitting layer/electron transport layer/n-type-dopant-containing electron injection layer/cathode/, without using the n-type-dopant-containing electron transport layer doped with a compound which contains a metallic atom or ion thereof shown in FIG. 6. A volume ratio (concentration) of the metallic atom or ion thereof diffused from the n-type-dopant-containing electron injection layer containing a metallic atom or ion thereof to the electron transport layer may be maintained within a range of 0.1 vol %-100 vol %. In these cases, the metallic atom or ion thereof is not diffused to the light-emitting layer due to these n-type-dopant blocking layers, although it is diffused in general from the layers containing a metallic atom or ion thereof diffused into the electron injection layer or electron transport layer even at an element temperature of 20 centigrade or more.

--Substrate, Anode and Cathode--

The materials other than the glass transparent material used for the substrate 1 are semi-transparent materials e.g., a plastic material such as polystyrene, and opaque materials e.g., silicon, Al or the like, further thermally curable resins such as a phenol resin, and a thermoplastic resin such as polycarbonate can be used.

The electrode materials of the anode 2 and the cathode 8 include metals or alloys thereof such as Ti, Al, Al, Cu, Ni, Ag, Mg:Ag, Au, Pt, Pd, Ir, Cr, Mo, W, Ta or the like or alloys thereof. Alternatively, conductive polymers such as polyaniline or PEDT:PSS can be used. Otherwise, an oxide transparent conductive thin film can be used whose main component is any of Indium Tin Oxide (ITO), Indium Zinc Oxide (IZO), Zinc Oxide, Tin Oxide or the like, for example. Furthermore, the thickness of each electrode is preferably on the order of 10 to 500 nm. The electrode material film is preferably manufactured by a method of vacuum deposition or sputtering.

It is preferable to use, for the anode 2, a selected conductive material having a high work function higher than that of the cathode 8. Furthermore, materials and/or thicknesses of the anode and cathode are selected and set so that a least one of the anode and cathode at the side to take out the emission of the light has to be transparent or semi-transparent. Specifically one or both of the anode and cathode is preferably made of a material having a transmissivity of at least 10% or more in the wavelength of light emitted from the light-emitting material.

--Organic Semiconductor Layer--

As for the materials as main components of the organic semiconductor layers including the hole injection layer 3, the hole transport layer 4, the light-emitting layer 5 and the n-type-dopant-containing electron transport layer 7, there are utilized organic compounds having the charge-transporting property (e.g., mobility of hole and/or electron).

As for organic compounds capable of transporting electrons each a main component of the light-emitting layer or the electron transport layer or the electron injection layer, such as polycyclic compounds such as p-terphenyl, quaterphenyl, etc. as well as derivatives thereof, condensed polycyclic hydrocarbon compounds such as naphthalene, tetracene, pyrene, coronene, chrysene, anthracene, diphenylanthracene, naphthacene, phenanthrene, etc. as well as derivatives thereof, or condensed heterocyclic compounds such as phenanthroline, bathophenanthroline, phenanthridine, acridine, quinoline, quinoxaline, phenazine, etc. as well as derivatives thereof, and fluoroceine, perylene, phthaloperylene, naphthaloperylene, perynone, phthaloperynone, naphthaloperylene, diphenylbutadiene, tetraphenylbutadiene, oxadiazole, aldazine, bisbenzoxazoline, bisstyryl, pyrazine, cyclopentadiene, oxine, aminoquinoline, imine, diphenylethylene, vinylanthracene, diaminocarbazole, pyrane, thiopyrane, polymethine, merocyanine, quinacridone, rubrene, etc. as well as derivatives thereof can be used.

In addition, other organic compounds capable of transporting electrons, such as metal-chelated complex compounds, suitable metal-chelated oxanoide compounds are metal complexes which contain, as a ligand thereof, at least one selected from 8-quinolinolato and derivatives thereof such as tris(8-quinolinolato)aluminum,
bis(8-quinolinolato)magnesium,
bis[benzo(f)-8-quinolinolato]zinc,
bis(2-methyl-8-quinolinolato)aluminum,
tri(8-quinolinolato)indium,
tris(5-methyl-8-quinolinolato)aluminum,
8-quinolinolato lithium,
tris(5-chloro-8-quinolinolato)gallium,
bis(5-chloro-8-quinolinolato)calcium or the like can be used.

In addition, other organic compounds capable of transporting electrons, such as oxadiazoles, triazines, stilbene derivatives and distyrylarylene derivatives, styryl derivatives, diolefin derivatives can be used preferably.

Furthermore, other organic compounds capable of transporting electrons, such as the group of benzoxazoles such as
2,5-bis(5,7-di-t-pentyl-2-benzoxazolyl)-1,3,4-thiazole,
4,4'-bis(5,7-t-pentyl-2-benzoxazolyl)stilbene,
4,4'-bis[5,7-di(2-methyl-2-butyl)-2-benzoxazolyl]stilbene,
2,5-bis(5,7-di-t-pentyl-2-benzoxazolyl)thiophene,
2,5-bis[5-(α,α-dimethylbenzyl)-2-benzoxazolyl]thiophene,
2,5-bis[5,7-di(2-methyl-2-butyl)-2-benzoxazolyl]-3,4-dipheny lthiophene,
2,5-bis(5-methyl-2-benzoxazolyl)thiophene,
4,4'-bis(2-benzoxazolyl)biphenyl,
5-methyl-2-{2-[4-(5-methyl-2-benzoxazolyl)phenyl]vinyl}benzoxazole,
2-[2-(4-chlorophenyl)vinyl]naphtho(1,2-d)oxazole, etc.; and the group of benzothiazoles such as
2,2'-(p-phenylenedipynylene)-bisbenzo thiazole, etc.; and the group of benzoimidazoles such as
2-{2-[4-(2-benzoimidazolyl)phenyl]vinyl}benzoimidazole,
2-[2-(4-carboxyphenyl)vinyl]benzoimidazole, etc. can be used.

Furthermore, other organic compounds capable of transporting electrons, such as 1,4-bis(2-methylstyryl)benzene,
1,4-bis(3-methylstyryl)benzene,
1,4-bis(4-methylstyryl)benzene,
distyrylbenzene,
1,4-bis(2-ethylstyryl)benzene,
1,4-bis(3-ethylstyryl)benzene,
1,4-bis(2-methylstyryl)-2-methylbenzene,
1,4-bis(2-methylstyryl)-2-ethylbenzene or the like can be used.

In addition, other organic compounds capable of transporting electrons, such as 2,5-bis(4-methylstyryl)pyrazine,
2,5-bis(4-ethylstyryl)pyrazine,
2,5-bis[2-(1-naphthyl)vinyl]pyrazine,
2,5-bis(4-methoxystyryl)pyrazine,
2,5-bis[2-(4-biphenyl)vinyl]pyrazine,
2,5-bis[2-(1-pyrenyl)vinyl]pyrazine or the like can be used.

Furthermore, other organic compounds capable of transporting electrons, such as 1,4-phenylene-dimethylidine,
4,4'-phenylenedimethylidine,
2,5-xylylene-dimethylidine,
2,6-naphthylenedimethylidine,
1,4-biphenylene-dimethylidine,
1,4-p-terephenylenedimethylidine,
9,10-anthracenediyldimethylidine,
4,4'-(2,2-di-t-butylphenylvinyl)biphenyl,
4,4'-(2,2-diphenylvinyl)biphenyl or the like can be used. In addition to these organic compounds, any of the well-known compounds conventionally used in the production of the prior art organic EL devices may be suitably used.

Whereas, organic compounds capable of transporting holes, such as N,N,N',N'-tetraphenyl-4,4'-diaminophenyl,
N,N'-diphenyl-N,N'-di(3-methylphenyl)-4,4'-diaminobiphenyl,
2,2-bis(4-di-p-tolylaminophenyl)propane,
N,N,N',N'-tetra-p-tolyl-4,4'-diaminobiphenyl,
bis(4-di-p-tolylaminophenyl)phenylmethane,
N,N'-diphenyl-N,N'-di(4-methoxyphenyl)-4,4'-diaminobiphenyl,
N,N,N',N'-tetraphenyl-4,4'-diaminodiphenylether,
4,4'-bis(diphenylamino)quadriphenyl,
4-N,N-diphenylamino-(2-diphenylvinyl)benzene,
3-methoxy-4'-N,N-diphenylaminostilbenzene,
N-phenylcarbazole,
1,1-bis(4-di-p-triaminophenyl)cyclohexane,
1,1-bis(4-di-p-triaminophenyl)-4-phenylcyclohexane,
bis(4-dimethylamino-2-methylphenyl)phenylmethane,
N,N,N-tri(p-tolyl)amine,
4-(di-p-tolylamino)-4'-[4-(di-p-tolylamino)styryl]stilbene,
N,N,N',N'-tetraphenyl-4,4'-diaminobiphenyl N-phenylcarbazole,
4,4'-bis[N-(1-naphthyl)-N-phenylamino]biphenyl,
4,4"-bis[N-(1-naphthyl)-N-phenylamino]p-terphenyl,
4,4'-bis[N-(2-naphthyl)-N-phenylamino]biphenyl,
4,4'-bis[N-(3-acenaphthenyl)-N-phenylamino]naphthalene,
4,4'-bis[N-(9-anthryl)-N-phenylamino]biphenyl,
4,4"-bis[N-(1-anthryl)-N-phenylamino]p-terphenyl,
4,4'-bis[N-(2-phenanthryl)-N-phenylamino]biphenyl,
4,4'-bis[N-(8-fluoranthenyl)-N-phenylamino]biphenyl,
4,4'-bis[N-(2-pyrenyl)-N-phenylamino]biphenyl,
4,4'-bis[N-(2-perylenyl)-N-phenylamino]biphenyl,
4,4'-bis[N-(1-coronenyl)-N-phenylamino]biphenyl, 2,6-bis(di-p-tolylamino)naphthalene,
2,6-bis[di-(1-naphthyl)amino]naphthalene,
2,6-bis[N-(1-naphthyl)-N-(2-naphthyl)amino]naphthalene,
4,4"-bis[N,N-di(2-naphthyl)amino]terphenyl,
4,4'-bis{N-phenyl-N-[4-(1-naphthyl)phenyl]amino}biphenyl,
4,4'-bis[N-phenyl-N-(2-pyrenyl)amino]biphenyl,
2,6-bis[N,N-di(2-naphthyl)amino]fluorene,
4,4"-bis(N,N-di-p-tolylamino)terphenyl,
bis(N-1-naphthyl)(N2-naphthyl)amine or the like can be used.

Further, in the case of formation of the hole injection layer, the hole transport layer and the hole-transporting luminescent layer, a dispersion of the above-described organic compounds in a polymer or a polymerized product of such organic compounds may be used. Moreover, so-called "π-conjugate polymers" such as polyparaphenylene vinylene and its derivatives, hole-transporting non-conjugate polymers, one typical example of which is poly(N-vinylcarbazole), and σ-conjugate polymers of polysilanes may be used for the same purpose.

For the material of the hole injection layer, which is not restricted to a specific one, metal phthalocyanines such as copper phthalocyanine (CuPc), a Copper complex, etc. as well as non-metal phthalocyanines, and electrically conducting polymers such as carbon films, polyanilines, etc. may be suitably used in the formation thereof.

--N-Type Dopant Containing Electron Transport Layer--

The n-type-dopant-containing electron transport layer comprises, as a main component, one of the organic compounds capable of transporting electrons (which is selected from the organic compounds capable of transporting electrons mentioned above) to which at least one of electron donating materials of n-type dopants e.g., an alkaline metal such as Li, Na, K, Rb, Cs, etc. and an alkaline earth metal such as Be, Mg, Ca, B, etc. and a rare earth metal such as Sc, Y, Yb, Eu, Sm, Ce, etc. and a halide thereof such as LiF, CsF, etc. and a salt of metal oxide thereof such as $Cs_2MoO_4$, $Cs_2WO_4$, etc. and an organic compound synthesized therewith such as BLiq4, CsTPB, etc., but the n-type dopant is not limited thereto. Especially, the metal with a high work function of 4.5 eV or less such as Cs, Li, Na, K, Be, Mg, Ca, Sr, Ba, Y, La, Mg, Sm, Gd, Yb, or a compound synthesized therewith is preferably used for the n-type dopant.

--N-Type Dopant Blocking Layer--

The inventor proposes providing an n-type-dopant-blocking layer having an interface contacting with the n-type-dopant-containing electron transport layer to block the n-type dopant (metal or ion thereof) such as an alkaline metal compound diffusing from the n-type-dopant-containing electron transport layer to an adjacent layer. The inventor proposes adding a heavy atom compound to the n-type-dopant blocking layer to demonstrate its ability as the internal heavy atom effect.

The inventor directs his attention to the internal heavy atom effect caused by a heavy atom. For example, the inventor aimed at a high magnetic moment of heavy atom complex such as an Ir complex or the like well known as a phosphorescence material. The strong donor of alkaline metal compound in the n-type-dopant-containing electron transport layer with low ionization energy is apt to become a cation e.g., Cs becomes $Cs^+$. The inventor has made an experiment and revealed that cations repel the atomic nucleus of heavy atom in the phosphorescence material to prevent the cations from diffusing. The inventor has proposed both to make a combination of a compound which contains heavy atoms (heavy atom compound) and a metal with a low work function (n-type dopant) such as alkaline metal or the like and, further, to make a volume ratio concentration of the heavy atom compound in the n-type-dopant blocking layer equal to or higher than a volume ratio concentration of the n-type dopant in the n-type-dopant-containing electron transport layer. There is obtained restraint on diffusion of ions of metal (alkaline metal, alkaline earth metal or the like) due to the internal heavy atom effect in the n-type-dopant blocking layer. The "heavy atom" with a large atomic number is a central metal in a metal complex or the like. The mass of atom is dependent almost on an atomic nucleus. Consider that electrons travel in circular orbits around the nucleus of the heavy atom (orbiting electron), the electron in a circular orbit looks like a current loop. The heavier the central nucleus is, the greater the circular current becomes. The heavy atom produces a large magnetic moment. Another produced magnetic moment is associated with the electron's rotation (electron spin). The two magnetic moment interaction, Spin-Orbit Coupling (SOC) becomes large in the heavy atom.

As used the present invention, the heavy atom includes an atom of atomic weight heavier than that of bromine Br, i.e., atomic weight of 79 or more and preferably of from 100 or more to 200 or less. The heavy atom is selected from the Ir, Pt, Os, Re, Au, W, Ru, Hf, Eu, Tb, or the like, or a rare earth metal, e.g., a central atom of a well known phosphorescence complex. The heavy atom compound, which contains the heavy atoms, is used for the n-type-dopant blocking layer. The reason for the condition of the heavy atom having atomic weight heavier than that of bromine Br heavy atom is that bromine Br or heavier atom exhibits the heavy atom effect ("Photochemical Dimerization of Acephenanthrylene and the Heavy Atom Effect" J. Org. Chem., 65 (2), 450-452, (2000)).

As used the present invention, the heavy atom compound includes a phosphorescence compound and, preferably a complex-based compound which contains a Group VIII metal in the periodic table of the elements. In addition, the heavy atom compound includes preferably Iridium compounds, Osmium compounds, or Platinum compound (Platinum complex-based compound).

[Embodiments]

--Embodiments 1 and 2--

A plurality of organic EL devices (Embodiment 1) were fabricated in such a manner that each organic EL device included an n-type-dopant-containing electron transport layer (in which an organic compound capable of transporting electrons, 2,9-Bis(naphthalen-2-yl)-4,7-diphenyl-1,10-phenanthroline (abbreviated as NBphen) as a first component was mixed with an n-type dopant $Cs_2MoO_4$ containing Cs of alkaline metal as an electron donor of a second component) and an n-type-dopant blocking layer (in which an organic compound capable of transporting electrons, 1,3,5-Triazine derivatives (abbreviated as TRZ) as a third component was mixed with a heavy atom compound i.e., Tris(2-phenylpyridine)iridium(III) (abbreviated as Ir(ppy)3) containing at least one kind of heavy atoms with an atomic weight of 79 or more "heavy atom (Ir: 192)" as a fourth component). Then some characteristics of those devices were measured and also a blocking effect of the n-type-dopant blocking layer against ions of alkaline metal (Cs) was measured and evaluated.

Specifically, an anode of transparent electrode ITO was formed on a glass substrate. Through a vacuum evaporation method, in sequence, a hole injection layer of Copper Phthalocyanine (CuPc) with a thickness of 25 nm was formed on the anode, and then a hole transport layer of N,N'-bis(naphthalene-2-yl)-N,N'-diphenyl-benzidene (abbreviated as NPB) with a thickness of 45 nm are formed on the hole injection layer, and then an organic light-emitting layer of Tris(8-hydroxyquinolinato)aluminum(III) (abbreviated as Alq3) containing a "light atom (Al: 27) with a thickness of 30 nm are formed on the hole transport layer. Furthermore, the foregoing procedures were repeated until the formation of the organic light-emitting layer of Alq3 and plural same precursors were fabricated for each precursor of embodiments. Plural n-type-dopant blocking layers of TRZ containing the heavy atom compound Ir(ppy)3 were co-evaporated with a thickness of 10 nm at concentrations of 7 vol %, 30 vol %, and 100 vol % on the organic light-emitting layers respectively, and then individually plural the electron transport layers of NBphen containing $Cs_2MoO_4$ of the n-type dopant were co-evaporated with a thickness of 20 nm at a concentration of 1.7 vol % on the n-type-dopant blocking layers respectively. Then, a cathode of Al was formed on each n-type dopant containing electron-transporting layer with a predetermined thickness through a vacuum evaporating method. In this way, plural organic EL devices of Embodiments 1 were fabricated. The device structure of Embodiment 1 is as follows:

Such Embodiment 1 had, in order of ITO/hole injection layer/hole transport layer/light-emitting layer/n-type-dopant blocking layer/electron transport layer/Al, ITO/CuPc (25)/NPB (45)/Alq3 (30)/(Concentration×vol %=7 vol %, 30 vol %, 100 vol %)-Ir(ppy)3:TRZ(10)/1.7 vol %-$Cs_2MoO_4$:NBphen (20)/Al. Here, the content in the last parentheses ( ) in each layer section denotes a thickness (nm).

Plural organic EL devices of Embodiments 2 were fabricated in the same manner as Embodiments 1, except that plural n-type-dopant blocking layers of Alq3 containing the heavy atom compound of 2,3,7,8,12,13,17,18-Octaethyl-21H, 23H-porphine, platinum(II) (abbreviated as PtOEP) containing a "heavy atom (Pt: 195)" were co-evaporated with a thickness of 10 nm at concentrations of 8.3 vol %, 30 vol % and 100 vol % on the organic light-emitting layers respectively, instead of the n-type-dopant blocking layer of TRZ in Embodiment 1. The device structure of Embodiment 2 has, in order of ITO/hole injection layer/hole transport layer/light-emitting layer/n-type-dopant blocking layer/electron transport layer/Al, ITO/CuPc(25)/NPB(45)/Alq3(30)/(Concentration×vol %=8.3 vol %, 30 vol %, 100 vol %)-PtOEP:Alq3 (10)/1.7 vol %-$Cs_2MoO_4$:NBphen(20)/Al. Here, the content in the last parentheses ( ) in each layer section denotes a thickness (nm).

Plural organic EL devices of Comparative examples 1 and 2 were fabricated in the same manner as Embodiments 1, except that the n-type-dopant blocking layer was omitted and the light-emitting layers had thicknesses of 30 nm and 40 nm respectively. The device structures of Comparative examples 1 and 2 have, in order of ITO/hole injection layer/hole transport layer/light-emitting layer/electron transport layer/Al, respectively, ITO/CuPc(25)/NPB(45)/Alq3(30)/1.7 vol %-$Cs_2MoO_4$:NBphen(30)/Al (this is called as ref1), and ITO/CuPc(25)/NPB(45)/Alq3(40)/1.7 vol %-$Cs_2MoO_4$:NBphen (20)/Al (this is called as ref2). Here, the content in the last parentheses ( ) in each layer section denotes a thickness (nm).

As for Embodiments 1 and 2 and Comparative examples 1 and 2, these were driven respectively under a condition of current density of 7.5 mA/cm² at a high temperature preservation environment (85° C., 100 hours), and then luminance of change (cd/m²) of difference between the initial luminance and the 100 hours elapsed luminance of those devices were measured.

The tested results are shown in the following Table 1, in which the correlation between the heavy atom compound concentrations of the n-type-dopant blocking layer and luminance of change was measured.

TABLE 1

|  | Concentration X ( vol %) | Luminance of change (cd/m²) |
|---|---|---|
| Embodiment 1 | 100 | +17 |
|  | 30 | −59 |
|  | 7 | −71 |
| Embodiment 2 | 100 | +18 |
|  | 30 | −29 |
|  | 8.3 | −35 |
| ref1 | — | −272 |
| ref2 | — | −75 |

As seen from these results, the embodiment devices exhibited a luminance of change kept constant when having the heavy atom compound concentration of 100 vol % in the n-type-dopant blocking layer because if device's luminance of change is kept at −10 cd/m² or more then such a device is almost for practical use, as a rule of thumb.

Figure 7:
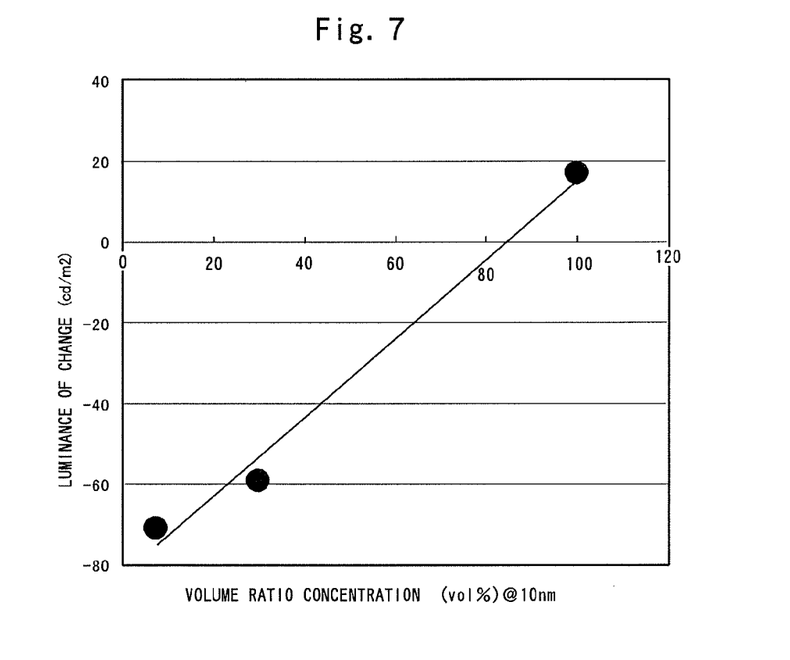
Figure 8:
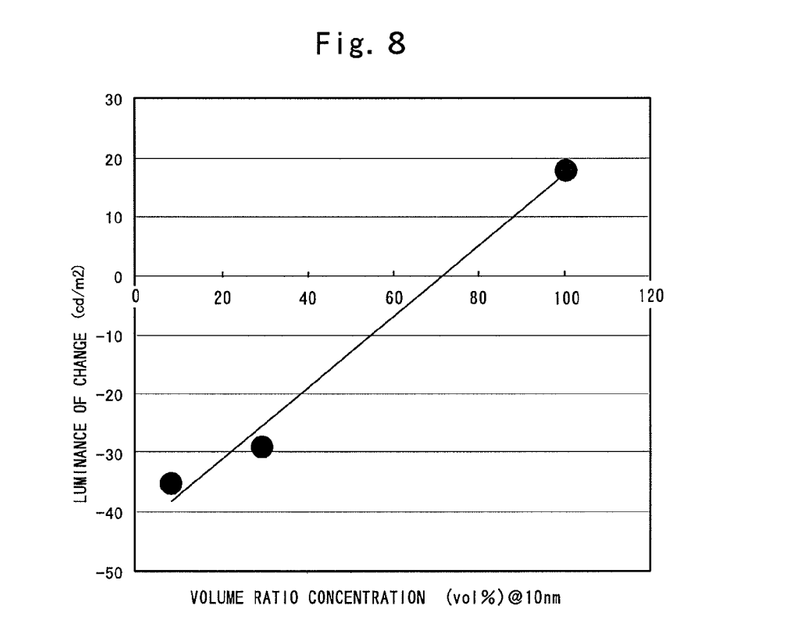

In addition, as for the devices of Embodiments 1 and 2, the dependency of luminance of change on the concentration of the heavy atom compound in the n-type-dopant blocking layer was examined. The luminances of change were plotted with respect to the volume ratio (vol %) of the heavy atom compound Ir(ppy)3 to PtOEP in the n-type-dopant blocking layer of Embodiments 1 and 2. FIGS. 7 and 8 show luminance of change characteristics with respect to volume ratios of heavy atom compounds in Embodiments 1 and 2 respectively.

As seen from FIGS. 7 and 8, when the volume ratios of the heavy atom compound Ir(ppy)3 to PtOEP are 80 vol % or more and 70 vol % or more then the luminance of change exceeds −10 cd/m² and is kept and therefore, it is expected to prolong the device's life span.

--Embodiment 3--

For Embodiment 3, plural organic EL devices were fabricated using an n-type-dopant-containing electron transport layer containing another n-type dopant.

Plural organic EL devices of Embodiments 3 were fabricated in the same manner as Embodiments 1, except that n-type-dopant blocking layers made of Ir(ppy)3 at 100 vol % and n-type-dopant-containing electron transport layers of the n-type dopant of tungstate $Cs_2WO_4$ instead of the molybdate $Cs_2MoO_4$ were layered respectively. The device structure of Embodiment 3 has, in order of ITO/hole injection layer/hole transport layer/light-emitting layer/n-type-dopant blocking layer/electron transport layer/Al, ITO/CuPc(25)/NPB(40)/Ir (ppy)3-9 vol %: TRZ(40)/1.7 vol %-$Cs_2WO_4$:NBphen(20)/Al. Here, the content in the last parentheses ( ) in each layer section denotes a thickness (nm).

Plural organic EL devices of Comparative examples 3 were fabricated in the same manner as Comparative examples 2, except that the n-type dopant of tungstate was used for the electron transport layer instead of the molybdate of the n-type dopant. The device structure of Comparative examples 3 had ITO/CuPc(25)/NPB(45)/Alq3(40)/1.7 vol %-$Cs_2WO_4$:NBphen(20)/Al (this is called as ref3). Here, the content in the last parentheses ( ) in each layer section denotes a thickness (nm).

As for Embodiments 3 and Comparative examples 1, 2 and 3, these were driven respectively under a condition of current density of 7.5 mA/cm² at a high temperature preservation environment (85° C., 100 hours), and then luminance of change (cd/m²) of difference between the initial luminance and the 100 hours elapsed luminance of those devices were measured.

The tested results are shown in the following Table 2. When the device structures of Embodiments 1 and 3 have ITO/

CuPc/NPB/9 vol %-Ir(ppy)3:TRZ/Y/Al, then Y column denotes components contained by the n-type-dopant-containing electron transport layer of Y.

TABLE 2

| | Y | Luminance of change (cd/m$^2$) |
|---|---|---|
| Embodiment 1 | 1.7%-Cs$_2$MoO$_4$: NBphen | +17 |
| Embodiment 3 | 1.7%-Cs$_2$WO$_4$: NBphen | +23 |
| ref1 | — | −272 |
| ref2 | — | −75 |
| ref3 | — | −86 |

As seen from these results, the embodiment devices using the n-type-dopant-containing electron transport layer (1.7 vol %-Cs$_2$WO$_4$: NBphen) exhibited a luminance of change kept constant caused by the n-type-dopant blocking layer.

--Embodiments 4 and 5--

For other Embodiments, plural organic EL devices were fabricated using an n-type-dopant blocking layer serving as a light-emitting layer unified in one piece so as to be an n-type dopant-blocking light-emitting layer having an increased thickness.

A plurality of organic EL devices (Embodiment 4) were fabricated in such a manner that each organic EL device included an n-type-dopant-containing electron transport layer (in which an organic compound capable of transporting electrons of NBphen as a first component was mixed with an n-type dopant Cs$_2$MoO$_4$ containing Cs of alkaline metal as an electron donor of a second component) and an n-type-dopant blocking light-emitting layer (in which an organic compound capable of transporting electrons of TRZ (host material) as a third component was mixed with a heavy atom compound of Ir(ppy)3 containing at least one kind of heavy atoms with an atomic weight of 79 or more as a fourth component (phosphorescence guest material)). Then some characteristics of those devices were measured and also a blocking effect of the n-type-dopant blocking layer against ions of alkaline metal (Cs) was measured and evaluated.

Specifically, an anode of transparent electrode ITO was formed on a glass substrate. Through a vacuum evaporation method, in sequence, a hole injection layer of Copper Phthalocyanine (CuPc) with a thickness of 25 nm was formed on the anode, and then a hole transport layer of NPB with a thickness of 40 nm are formed on the hole injection layer, and then an n-type dopant-blocking light-emitting layer of TRZ containing the heavy atom compound Ir(ppy)3 at a concentration of 9 vol % with a thickness of 40 nm are formed on the hole transport layer. Furthermore, the foregoing procedures were repeated until the formation of the n-type dopant-blocking light-emitting layer and plural same precursors were fabricated for each precursor of embodiments. Then individually plural the electron transport layers of NBphen containing Cs$_2$MoO$_4$ of the n-type dopant were co-evaporated with a thickness of 20 nm at concentrations of 1.7 vol %, 5 vol %, 10 vol %, 20 vol % on the n-type dopant-blocking light-emitting layers respectively. Then, a cathode of Al was formed on each n-type dopant containing electron-transporting layer with a predetermined thickness through a vacuum evaporating method. In this way, plural organic EL devices of Embodiments 4 were fabricated. The device structure of Embodiment 4 is as follows:

Such Embodiment 4 had, in order of ITO/hole injection layer/hole transport layer/n-type dopant-blocking light-emitting layer/electron transport layer/Al, Embodiment 4 は, ITO/CuPc(25)/NPB(40)/9 vol %-Ir(ppy)3:TRZ(40)/(Concentration×vol %=1.7 vol %, 5 vol %, 10 vol %, 20 vol %)-Cs$_2$MoO$_4$:NBphen(20)/Al. Here, the content in the last parentheses ( ) in each layer section denotes a thickness (nm).

Plural organic EL devices of Embodiments 5 were fabricated in the same manner as Embodiments 4, except using an electron transport layer containing Cs$_2$WO$_4$ instead of the electron transport layer containing Cs$_2$MoO$_4$ in Embodiment 4. The device structure of Embodiment 5 has, in order of ITO/hole injection layer/hole transport layer/n-type dopant-blocking light-emitting layer/electron transport layer/Al, ITO/CuPc(25)/NPB(40)/9 vol %-Ir(ppy)3:TRZ(40)/1.7 vol %-Cs$_2$WO$_4$:NBphen(20)/Al. Here, the content in the last parentheses ( ) in each layer section denotes a thickness (nm).

As for Embodiments 4, 5, these were driven respectively under a condition of current density of 2.5 mA/cm$^2$ at a high temperature preservation environment (85° C., 100 hours), and then luminance of change (cd/m$^2$) of difference between the initial luminance and the 100 hours elapsed luminance of those devices were measured.

The tested results are shown in the following Table 3.

TABLE 3

| | Concentration X (vol %) | Current density (mA/cm$^2$) | Luminance of change (cd/m$^2$) |
|---|---|---|---|
| Embodiment 4 | 20 | 2.5 | — |
| | 10 | 2.5 | −320 |
| | 5 | 2.5 | −13 |
| | 1.7 | 2.5 | +9 |
| Embodiment 5 | 1.7 | 2.5 | −10 |
| Embodiment 1 | 1.7 | 7.5 | −71 |
| ref1 | — | 7.5 | −272 |
| ref2 | — | 7.5 | −75 |
| ref3 | — | 7.5 | −86 |

As seen from these results, since the n-type dopant-blocking light-emitting layer has an increased thickness, luminance deterioration is prevented even if the n-type dopant (a metallic atom or ion thereof) contained increasingly in the electron transport layer. Furthermore, when using the light-emitting layer of Alq3, its emission intensity is weaken and the current value of the device is set to be high. In addition, it is found that the use of Cs$_2$MoO$_4$ concentration less than 10 vol % in the n-type-dopant-containing electron transport layer prevents the luminance deterioration effectively.

In the foregoing every Embodiment, the volume ratio concentration of the heavy atom compound in the n-type-dopant blocking layer is equal to or higher than that of n-type dopant in the n-type-dopant-containing electron transport layer. When such a concentration condition is satisfied, the restriction against diffusion of the n-type dopant may be expected. The concentration of the heavy atom compound is set within a range of from 0.1 vol % to 100 vol %. The concentration of the n-type dopant is set within 0.1 vol %-100 vol %.

In addition to the foregoing Embodiments of organic EL devices mentioned above, the present invention is adaptable to organic semiconductor devices, and includes an organic solar cell comprising a plurality of organic semiconductor layers including a light collecting layer, and at least one of an electron transport layer and a hole transport layer as an organic semiconductor device. The device comprising an electron injection layer and an n-type-dopant blocking layer of the organic compound preventing electron donating materials from passing through an interface contacting with the electron injection layer can achieve advantageous effects similar to the foregoing Examples' effects of prolongment in the device's life span and of moisture resistance of the device.

The invention claimed is:

1. An organic electroluminescence device comprising:
a pair of anode and cathode opposed to each other;
a plurality of organic semiconductor layers layered or disposed between the anode and the cathode, the organic semiconductor layers including an organic light-emitting layer; and
an n-type-dopant-containing electron transport layer disposed between the cathode and the organic light-emitting layer, the n-type-dopant-containing electron transport layer including an organic compound capable of transporting electrons as a first component which is mixed with an n-type dopant of an electron donor of metallic atom or ion thereof as a second component,
the organic electroluminescence device further comprising an n-type-dopant blocking layer having an interface contacting with the n-type-dopant-containing electron transport layer to block the n-type dopant,
wherein the n-type-dopant blocking layer comprises any one of Iridium compounds, Osmium compounds, or Platinum compounds,
wherein a volume ratio concentration of the heavy atom compound in the n-type-dopant blocking layer is equal to or higher than a volume ratio concentration of the n-type dopant in the n-type-dopant-containing electron transport layer.

2. The organic electroluminescence device according to claim 1, wherein the n-type dopant of the n-type-dopant-containing electron transport layer is an alkaline metal, alkaline earth metal or a compound thereof.

3. The organic electroluminescence device according to claim 1, wherein the n-type-dopant blocking layer has an interface contacting with the organic light-emitting layer.

4. The organic electroluminescence device according to claim 1, wherein the n-type-dopant blocking layer and the organic light-emitting layer are unified as one piece.

5. The organic electroluminescence device according to claim 1, further comprising an electron injection layer disposed at a cathode side of the n-type-dopant-containing electron transport layer.

6. The organic electroluminescence device according to claim 1, wherein a concentration of the heavy atom compound is within a range of from 0.1 vol% to 100 vol%.

7. The organic electroluminescence device according to claim 1, wherein a concentration of the n-type dopant is within 0.1 vol% - 100 vol%.

8. The organic electroluminescence device according to claim 1, wherein the metallic atom or ion thereof is one or more selected from Li, Na, K, Rb, Cs, Be, Mg, Ca, Ba, Sc, Y, Yb, Eu, Sm, and Ce.

9. The organic electroluminescence device according to claim 1, wherein one of the anode and the cathode is semi-transparent or transparent, alternatively the anode and the cathode is transparent.

* * * * *